(12) United States Patent
Zhang

(10) Patent No.: US 9,973,146 B2
(45) Date of Patent: May 15, 2018

(54) AMPLIFYING CIRCUIT

(71) Applicant: SHENZHEN GOODIX TECHNOLOGY CO., LTD., Shenzhen, Guangdong (CN)

(72) Inventor: Mengwen Zhang, Guangdong (CN)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 0 days. days.

(21) Appl. No.: 15/657,618

(22) Filed: Jul. 24, 2017

(65) Prior Publication Data

US 2017/0331432 A1    Nov. 16, 2017

Related U.S. Application Data

(63) Continuation of application No. PCT/CN2016/090469, filed on Jul. 19, 2016.

(30) Foreign Application Priority Data

Feb. 19, 2016   (CN) .......................... 2016 1 0095911

(51) Int. Cl.
*H03F 3/04* (2006.01)
*H03F 1/02* (2006.01)
(Continued)

(52) U.S. Cl.
CPC ........... *H03F 1/0205* (2013.01); *H03F 1/301* (2013.01); *H03F 1/32* (2013.01); *H03F 3/187* (2013.01);
(Continued)

(58) Field of Classification Search
CPC ................ H03F 3/04; H03F 3/20; H03G 3/30
(Continued)

(56) References Cited

U.S. PATENT DOCUMENTS

| 6,717,467 B2* | 4/2004 | Renous ................. H03F 3/3023 330/253 |
| 7,990,217 B2* | 8/2011 | Gilbert ..................... H03F 1/26 330/254 |

(Continued)

FOREIGN PATENT DOCUMENTS

| CN | 103023502 A | 4/2013 |
| CN | 104020914 A | 9/2014 |
| CN | 104268530 A | 1/2015 |

*Primary Examiner* — Henry Choe
(74) *Attorney, Agent, or Firm* — Heslin Rothenberg Farley & Mesiti P.C.

(57) ABSTRACT

An amplifying circuit includes a reference voltage generating circuit, a common-mode voltage conversion circuit, a common-mode negative feedback circuit, and an amplifying sub-circuit. The reference voltage generating circuit generates a first reference voltage, a second reference voltage, and a reference common-mode voltage according to a post-stage common-mode voltage. The common-mode voltage conversion circuit converts the pre-stage output differential signal into a differential input signal according to the reference common-mode voltage. The common-mode negative feedback circuit generates a control voltage to quickly establish a common-mode negative feedback of the amplifying sub-circuit, wherein the first reference voltage and the second reference voltage are used to cancel a baseline signal of the pre-stage output differential signal. The amplifying circuit can eliminate the baseline signal, convert the common-mode voltage and quickly establish the common-mode negative feedback.

26 Claims, 7 Drawing Sheets

(51) Int. Cl.
*H03F 1/30* (2006.01)
*H03F 1/32* (2006.01)
*H03F 3/187* (2006.01)

(52) U.S. Cl.
CPC .. *H03F 2200/129* (2013.01); *H03F 2200/222* (2013.01); *H03F 2200/471* (2013.01)

(58) Field of Classification Search
USPC .................................................. 330/296, 285
See application file for complete search history.

(56) References Cited

U.S. PATENT DOCUMENTS

| | | | |
|---|---|---|---|
| 9,836,070 B2* | 12/2017 | Fort | H03F 3/45179 |
| 2007/0279105 A1* | 12/2007 | Sunairi | H03K 19/018528 |
| | | | 327/108 |
| 2009/0309635 A1 | 12/2009 | Lee | |
| 2012/0313712 A1* | 12/2012 | Larsen | H03F 1/305 |
| | | | 330/297 |
| 2016/0268977 A1* | 9/2016 | Ito | H03F 1/42 |
| 2017/0366147 A1* | 12/2017 | Nagulapalli | H03F 3/45183 |

\* cited by examiner

AMPLIFYING CIRCUIT

CROSS-REFERENCE TO RELATED APPLICATIONS

The present application is a continuation of international application No. PCT/CN2016/090469 filed on Jul. 19, 2016, which claims priority to Chinese Patent Application No. 201610095911.6, filed on Feb. 19, 2016, both of which are hereby incorporated by reference in their entireties.

TECHNICAL FIELD

The present disclosure relates to an amplifying circuit, and more particularly, to an amplifying circuit which can eliminate a baseline signal, convert a common-mode voltage, and quickly establish a common-mode negative feedback.

BACKGROUND

With the development of science and technology, wearable electronic devices already have a function of heartbeat detection. However, the heartbeat signal detected by the heartbeat detection circuit in the wearable electronic device is very weak. To amplify the heartbeat signal to a quantifiable level, it is necessary to amplify the heartbeat signal detected by the heartbeat detection circuit by a programmable gain amplifier.

Specifically, the programmable gain amplifier is coupled to a pre-stage circuit such as a heartbeat detection circuit and a post-stage circuit such as an analog-to-digital converter (ADC). In general, the common-mode voltage of the output signal of the pre-stage circuit does not match the common-mode voltage of the programmable gain amplifier. When the post-stage circuit of the programmable gain amplifier does not match the common-mode voltage of the programmable gain amplifier itself, this may cause some problems such as an offset voltage of the post-stage circuit is changed, and the input common-mode point may be shifted, furthermore, the post-stage circuit cannot work normally when the condition is very serious. In addition, in the conventional switched capacitor common-mode negative feedback circuit, the programmable gain amplifier has to take a lot of time to establish a common-mode negative feedback of the programmable gain amplifier, such that the average power consumption of the programmable gain amplifier is increased.

In addition, the output signal of the heartbeat detection circuit includes a heartbeat signal and a baseline signal, the amplitude of the heartbeat signal is only $1/100$~$1/1000$ of that of the baseline signal, and in a Deep Submicron integrated circuit, the dynamic range of the programmable gain amplifier is only about 1V, such that the programmable gain amplifier comes into saturation due to the baseline signal when the heartbeat signal has not been amplified to a desired magnitude.

Therefore, there is a need for improvement in the related art.

SUMMARY

It is a primary object of the present application to provide an amplifying circuit that may eliminate a baseline signal, convert a common-mode voltage, and/or quickly establish a common-mode negative feedback to overcome one of the drawbacks of the related art.

In order to solve one of the above-mentioned technical problems, the present application provides an amplifying circuit coupled to a post-stage circuit. The amplifying circuit includes an amplifying sub-circuit for receiving a pre-stage output differential signal and a reference voltage generating circuit coupled to the amplifying sub-circuit, the reference voltage generating circuit generates a reference common-mode voltage, such that a common-mode voltage of the amplifying sub-circuit is substantially equal to a post-stage common-mode voltage of the post-stage circuit, and the reference voltage generating circuit generates a first reference voltage and a second reference voltage to eliminate a baseline signal of the pre-stage output differential signal.

The reference voltage generating circuit disclosed by the present application may generate, according to a post-stage common-mode voltage VCMI, a reference common-mode voltage VCMB having the same voltage value as that of the post-stage common-mode voltage VCMI by using a reference voltage generating circuit, and convert pre-stage output signals VIP and VIN having a common-mode voltage VCMF into input signals VAIP and VAIN having a reference common-mode voltage VCMB (i.e., a post-stage common-mode voltage VCMI) by using a common-mode voltage conversion circuit, so as to solve the problem that the common-mode voltage VCMF does not match the post-stage common-mode voltage VCMI. In addition, the amplifying circuit generates the reference voltages VRFP and VRFN to the programmable gain amplifying circuit by using the reference voltage generating circuit to eliminate the baseline signals which are in the pre-stage output signals VIP and VIN.

BRIEF DESCRIPTION OF THE DRAWINGS

In order to illustrate the embodiments of the present application or the technical solutions of the related art more clearly, the following accompanying drawings which are used in the description of the embodiments or the related art will be briefly introduced. It will be apparent that the drawings in the following description are only some embodiments of the present application and other drawings may be obtained by those skilled in the art based on these drawings without any creative work.

Figure 1:
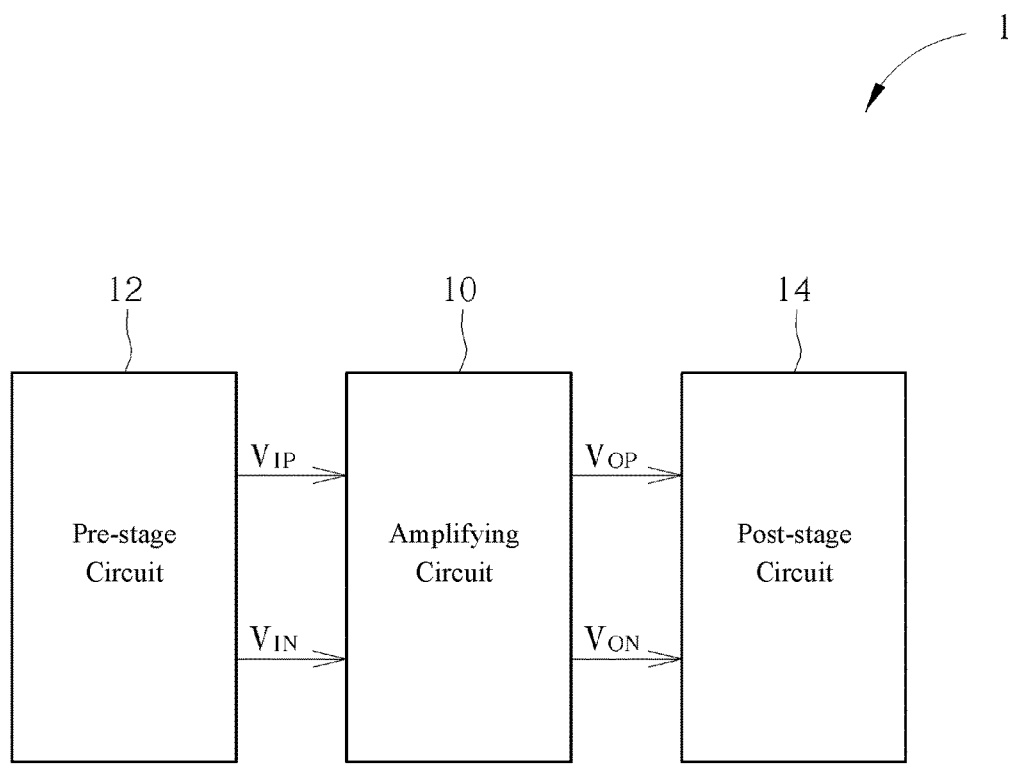
FIG. 1 is a schematic diagram of a differential amplifying system according to an embodiment of the present application.

DESCRIPTION FOR REFERENCE LABELS OR SYMBOLS 1 differential amplifying system
10 amplifying circuit
12 pre-stage circuit
14 post-stage circuit
101 reference voltage generating circuit
102 common-mode voltage conversion circuit
103 common-mode negative feedback circuit
104 programmable gain amplifying circuit
300 bias circuit
302, 80 differential amplifying circuit
304, 82, 84 current mirror
306 voltage equalization circuit
400, 402 common-mode half-circuit
500, 502 switched capacitor half-circuit
504 Fully Differential Operational Amplifier
C1, C1', C2, C2', $C_{F1}$, $C_{F2}$, $C_{F1'}$, $C_{F2'}$ capacitor
N1~N4, N1'~N4' terminal
$M_{301}$~$M_{312}$, $M_{800}$~$M_{810}$ transistor
ph1, ph2 frequency signal
$R_{REF1}$, $R_{REF2}$, $R_{CM}$, $R_{CM}'$ resistor
S1, S2, S1', S2', S3~S8, S3'~S8', Sr, switch
Sr1, Sr2, Sr3, S61, S62, S63, S64, S61',
S62', S63', S64'
$V_{IP}$, $V_{IN}$ pre-stage output signal
$V_{OP}$, $V_{ON}$ output signal
$V_{AIP}$, $V_{AIN}$ input signal
$V_{RFP}$, $V_{RFN}$ reference voltage
$V_{CMI}$, $V_{CMB}$ common-mode voltage
$V_{CTL}$ control voltage

DETAILED DESCRIPTION

The term "includes" mentioned throughout this specification and in the following claims is an open term and should be interpreted as "including but not limited to". In addition, the term "coupled" includes any direct and indirect means of electrical connection. Thus, where a first component is described as being coupled to a second component in this specification, it is meant that the first component may be electrically directly connected to the second component, or electrically indirectly connected to the second component through other components or connection means.

As shown in FIG. 1, FIG. 1 is a schematic diagram of a differential amplifying system 1 according to an embodiment of the present application. The differential amplifying system 1 includes an amplifying circuit 10 coupled to a pre-stage circuit 12 and a post-stage circuit 14, the pre-stage circuit 12 may include a heartbeat detection circuit, and the post-stage circuit 14 may include an analog-to-digital converter (ADC). The amplifying circuit 10 receives a pre-stage output differential signal (including a pre-stage output signal $V_{IP}$ and a pre-stage output signal $V_{IN}$) from the pre-stage circuit 12, and generates a differential output signal (including an output signal $V_{OP}$ and an output signal $V_{ON}$) according to the pre-stage output differential signal, and outputs the differential output signal to the post-stage circuit 14. The pre-stage output differential signal may include a useful signal and a baseline signal. The useful signal may be a heartbeat signal with relatively small amplitude compared to the baseline signal and the amplitude of the useful signal may be 1/100 of the amplitude of the baseline signal or even smaller. There is a common-mode voltage $V_{CMF}$ between the pre-stage output signal $V_{IP}$ and the pre-stage output signal $V_{IN}$, and the post-stage circuit 14 has a post-stage common-mode voltage $V_{CMI}$. The amplifying circuit 10 may include a programmable gain amplifying circuit. In general, when the common-mode voltage of the programmable gain amplifying circuit does not match the common-mode voltage $V_{CMF}$ of the pre-stage output signal, this may cause the programmable gain amplifying circuit not to work normally (when the programmable gain amplifying circuit does not match the common-mode of the pre-stage, this may cause the programmable gain amplifying circuit not to work normally, and when the programmable gain amplifying circuit does not match the common-mode of the post-stage, this may cause the post-stage not to work normally). On the other hand, when the common-mode voltage of the programmable gain amplifying circuit does not match the post-stage common-mode voltage $V_{CMI}$, this may cause the post-stage circuit 14 not to work normally.

Figure 2:
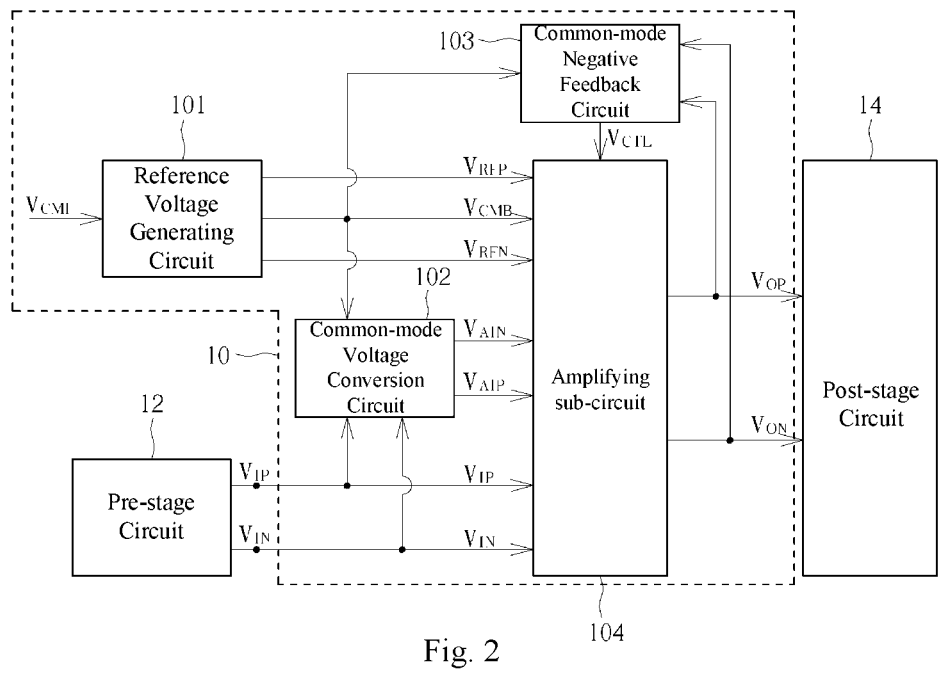
FIG. 2 is a schematic diagram of an amplifying circuit according to an embodiment of the present application.

In order to solve the problem that the common-mode voltage of the programmable gain amplifying circuit does not match the common-mode voltage $V_{CMF}$ of the pre-stage output signal and the post-stage common-mode voltage $V_{CMI}$ and solve the problem that the useful signal is much smaller than the baseline signal, as shown in FIG. 2, FIG. 2 is a schematic diagram of an amplifying circuit 10 according to an embodiment of the present application, the amplifying circuit 10 includes a reference voltage generating circuit 101, a common-mode voltage conversion circuit 102, a common-mode negative feedback circuit 103, and a programmable gain amplifying circuit 104 (corresponding to the amplifying sub-circuits in the claims). The reference voltage generating circuit 101 can be used to solve the problem caused by that the common-mode voltage of the programmable gain amplifying circuit 104 does not match the post-stage common-mode voltage $V_{CMI}$ and the baseline signal is too large, specifically, the reference voltage generating circuit 101 generates, according to the post-stage common-mode voltage $V_{CMI}$, a reference common-mode voltage $V_{CMB}$ that is substantially equal to the post-stage common-mode voltage $V_{CMI}$, and outputs the reference common-mode voltage $V_{CMB}$ to the common-mode voltage conversion circuit 102, such that the common-mode voltage of the programmable gain amplifying circuit 104 is substantially equal to the post-stage common-mode voltage $V_{CMI}$. The closer the reference common-mode voltage gets to the post-stage common-mode voltage of the post-stage circuit, the better it could be, preferably, the difference between the reference common-mode voltage and the post-stage common-mode voltage of the post-stage circuit is plus or minus 20%, and more preferably, the reference common-mode voltage is equal to the post-stage common-mode voltage of the post-stage circuit. In addition, the reference voltage generating circuit 101 generates a reference voltage $V_{RFP}$ and a reference voltage $V_{RFN}$ and outputs them to the programmable gain amplifying circuit 104 to eliminate the baseline signals which are in the pre-stage output signals VIP and VIN, so as to solve the problem that the baseline signal is too large. It should be noted that the reference common-mode voltage $V_{CMB}$ is a common-mode voltage between the reference voltages $V_{RFP}$ and $V_{RFN}$, and the reference common-mode voltage $V_{CMB}$ has the same voltage value as that of the post-stage common-mode voltage $V_{CMI}$, and the difference between the reference common-mode voltage and the post-stage common-mode voltage of the post-stage circuit is less than or equal to a predetermined range.

The common-mode voltage conversion circuit 102 can be used to solve the problem that the common-mode voltage of the programmable gain amplifying circuit 104 does not match the common-mode voltage $V_{CMF}$ of the pre-stage output signal. Specifically, the common-mode voltage conversion circuit 102 is coupled to the pre-stage circuit 12 and the reference voltage generating circuit 101, receives the pre-stage output signals $V_{IP}$, $V_{IN}$ and the reference common-mode voltage $V_{CMB}$, converts the pre-stage output signals $V_{IP}$, $V_{IN}$ to a differential input signal according to the reference common-mode voltage $V_{CMB}$, wherein, the differential input signal includes an input signal $V_{AIP}$ and an input signal $V_{AIN}$, a common-mode voltage between the input signals $V_{AIP}$ and $V_{AIN}$ is also the reference common-mode voltage $V_{CMB}$, i.e., $V_{CMB}=(V_{AIP}+V_{AIN})/2$. In other words, the common-mode voltage conversion circuit 102 converts the pre-stage output signals $V_{IP}$, $V_{IN}$ having a common-mode voltage of the common-mode voltage $V_{CMF}$ to the input signals $V_{AIP}$, $V_{AIN}$ having the common-mode voltage of the reference common-mode voltage $V_{CMB}$ (i.e., the post-stage common-mode voltage $V_{CMI}$), and outputs the input signals $V_{AIP}$, $V_{AIN}$ to the programmable gain amplifying circuit 104.

The programmable gain amplifying circuit 104 is coupled to the pre-stage circuit 12, the reference voltage generating circuit 101, the common-mode voltage conversion circuit 102, and the common-mode negative feedback circuit 103, and is used to receive the pre-stage output signals $V_{IP}$ and $V_{IN}$, the reference voltages $V_{RFP}$ and $V_{RFN}$, the reference common-mode voltage $V_{CMB}$, the input signals $V_{AIP}$ and $V_{AIN}$, and the control voltage $V_{CTL}$, eliminate the baseline signals which are in the pre-stage output signals $V_{IP}$ and $V_{IN}$ according to the reference voltages $V_{RFP}$ and $V_{RFN}$, and generate the output signals $V_{OP}$ and $V_{ON}$ to the post-stage circuit 14. In addition, in order to quickly establish the common-mode negative feedback of the programmable gain amplifying circuit 104, the common-mode negative feedback circuit 103 is coupled to the programmable gain amplifying circuit 104 and the reference voltage generating circuit 101, generates a control voltage $V_{CTL}$ to the programmable gain amplifying circuit 104 according to the reference common-mode voltage $V_{CMB}$, so as to quickly establish the common-mode negative feedback of the programmable gain amplifying circuit 104.

In short, the amplifying circuit 10 generates, according to the post-stage common-mode voltage $V_{CMI}$, a reference common-mode voltage $V_{CMB}$ having the same voltage value as that of the post-stage common-mode voltage $V_{CMI}$ by using the reference voltage generating circuit 101, and converts the pre-stage output signals $V_{IP}$ and $V_{IN}$ having a common-mode voltage $V_{CMF}$ to the input signals $V_{AIP}$ and $V_{AIN}$ having a reference common-mode voltage $V_{CMB}$ (i.e., a post-stage common-mode voltage $V_{CMI}$) by using the common-mode voltage conversion circuit 102, so as to solve the problem that the common-mode voltage $V_{CMF}$ does not match the post-stage common-mode voltage $V_{CMI}$. In addition, the amplifying circuit 10 generates the reference voltages $V_{RFP}$ and $V_{RFN}$ to the programmable gain amplifying circuit 104 by using the reference voltage generating circuit 101, so as to eliminate the baseline signals which are in the pre-stage output signals $V_{IP}$ and $V_{IN}$.

Figure 3:
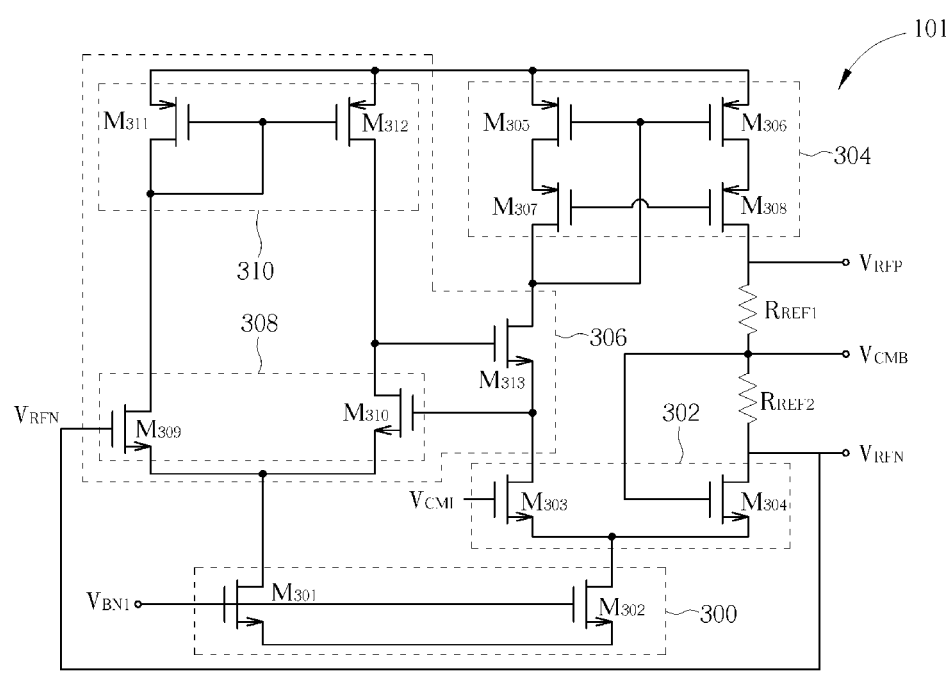
FIG. 3 is a schematic diagram of a reference voltage generating circuit according to an embodiment of the present application.

Specifically, as shown in FIG. 3, FIG. 3 is a schematic diagram of a reference voltage generating circuit 101 according to an embodiment of the present application. The reference voltage generating circuit 101 includes a bias circuit 300, a differential amplifying circuit 302, a current mirror 304 (corresponding to the first current mirror in the claims), reference resistors $R_{REF1}$, $R_{REF2}$, and a voltage equalization circuit 306. The bias circuit 300 is used to provide biasing of the differential amplifying circuit 302, the current mirror 304, and the voltage equalization circuit 306, and includes transistors $M_{301}$, $M_{302}$. In the following specification, the gate of the transistor corresponds to the control terminal of the transistor described in the claims, and the source and drain of the transistor may correspond to a first terminal or a second terminal of the transistors described in the claims. In order to reduce the power consumption, the proportion between the transistors $M_{301}$ and $M_{302}$ may be adjusted, i.e., there is a proportion between the currents passing through the transistors $M_{301}$ and $M_{302}$. Similarly, in order to reduce the power consumption, the proportion between the currents passing through the transistors $M_{303}$ and $M_{304}$ may be adjusted, or the proportion between the currents passing through the transistors $M_{305}$ and $M_{306}$ may be adjusted, or the proportion between the currents passing through the transistors $M_{307}$ and $M_{308}$ may be adjusted. A source of the transistor $M_{301}$ is coupled to a source of the transistor $M_{302}$, and a gate of the transistor $M_{301}$ and a gate of the transistor $M_{302}$ receive a bias voltage $V_{BN1}$. In addition, the differential amplifying circuit 302 includes transistors $M_{303}$ and $M_{304}$, the sources of the transistor $M_{303}$ and the transistor $M_{304}$ are both coupled to the drain of the transistor $M_{302}$, a gate of the transistor $M_{303}$ is used to receive the post-stage common-mode voltage $V_{CMI}$, a gate of the transistor $M_{304}$ is coupled to the reference resistors $R_{REF1}$, $R_{REF2}$ and is used to output the reference common-mode voltage $V_{CMB}$.

The current mirror 304 is coupled to the differential amplifying circuit 302 for providing a current of the differential amplifying circuit 302 and includes transistors $M_{305}$, $M_{306}$, $M_{307}$, and $M_{308}$. A source of the transistor $M_{305}$ is coupled to a source of the transistor $M_{306}$, drains of the transistors $M_{305}$ and $M_{306}$ are respectively coupled to the sources of the transistors $M_{307}$ and $M_{308}$, gates of the transistors $M_{305}$ and $M_{306}$ are coupled to a drain of the transistor $M_{307}$, and gates of the transistor $M_{307}$ and the transistor $M_{308}$ receive a bias Voltage $V_{BP}$. The reference resistors $R_{REF1}$ and $R_{REF2}$ have the same resistance value. A first terminal of the reference resistor $R_{REF1}$ is coupled to a drain of the transistor $M_{308}$, a second terminal of the reference resistor $R_{REF1}$ is coupled to a first terminal of the reference resistor $R_{REF2}$, a second terminal of the resistor $R_{REF2}$ is coupled to a drain of the transistor $M_{304}$, a gate of the transistor $M_{304}$ is coupled to a second terminal of the reference resistor $R_{REF1}$ and a first terminal of the reference resistor $R_{REF2}$. Thus, the first terminal of the reference resistor $R_{REF1}$ outputs the reference voltage $V_{RFP}$, the second terminal of the reference resistor $R_{REF2}$ outputs the reference voltage $V_{RFN}$, and the common-mode voltage between the reference voltages $V_{RFP}$ and $V_{RFN}$ is the reference common-mode voltage $V_{CMB}$.

The voltage equalization circuit 306 includes a differential amplifying circuit 308, a current mirror 310 (corresponding to the second current mirror in the claims), and a transistor $M_{313}$. The differential amplifying circuit 308 includes transistors $M_{309}$ and $M_{310}$, sources of the transistors $M_{309}$ and $M_{310}$ are both coupled to a drain of the transistor $M_{301}$, a gate of the transistor $M_{309}$ is coupled to a drain of the transistor $M_{304}$, and a gate of the transistor $M_{310}$ is coupled to a drain of the transistor $M_{303}$. The current mirror 310 includes transistors $M_{311}$ and $M_{312}$, a source of the transistor $M_{311}$ is coupled to a source of the transistor $M_{312}$, gates of the transistor $M_{311}$ and the transistor $M_{312}$ are coupled to a drain of the transistor $M_{311}$, and drains of the transistors $M_{311}$ and $M_{312}$ are coupled to drains of the transistors $M_{309}$ and $M_{310}$, respectively. A gate of the transistor $M_{313}$ is coupled to drains of the transistors $M_{310}$ and $M_{311}$, a drain of the transistor $M_{313}$ is coupled to a drain of the transistor $M_{307}$, and a source of the transistor $M_{313}$ is coupled to a gate of the transistor $M_{310}$ and a drain of the transistor $M_{303}$.

In short, the reference voltage generating circuit 101 uses the voltage equalization circuit 306 such that a drain voltage of the transistor $M_{303}$ is equal to a drain voltage of the transistor $M_{304}$, and offset of the transistor $M_{303}$ and the transistor $M_{304}$ caused by a channel modulation effect is reduced, such that a gate voltage of the transistor $M_{303}$ is substantially equal to a gate voltage of the transistor $M_{304}$, therefore, the reference common-mode voltage $V_{CMB}$ outputted from the gate of the transistor $M_{304}$ has the same voltage value as that of the post-stage common-mode voltage $V_{CMI}$ received by a gate of the transistor $M_{304}$, i.e. $V_{CMB}=V_{CMI}$, and the reference voltage generating circuit 101 has a wide output dynamic range. In addition, the reference voltage generating circuit 101 outputs the reference voltage $V_{RFP}$ and the reference voltage $V_{RFN}$ by using the reference resistor $R_{REF1}$ and the reference resistor $R_{REF2}$ having the same resistance value, respectively, such that a common-mode voltage between the reference voltage $V_{RFP}$ and the reference voltage $V_{RFN}$ is the reference common-mode voltage $V_{CMB}$, i.e. $V_{CMB}=(V_{RFP}+V_{RFN})/2$.

Figure 4:
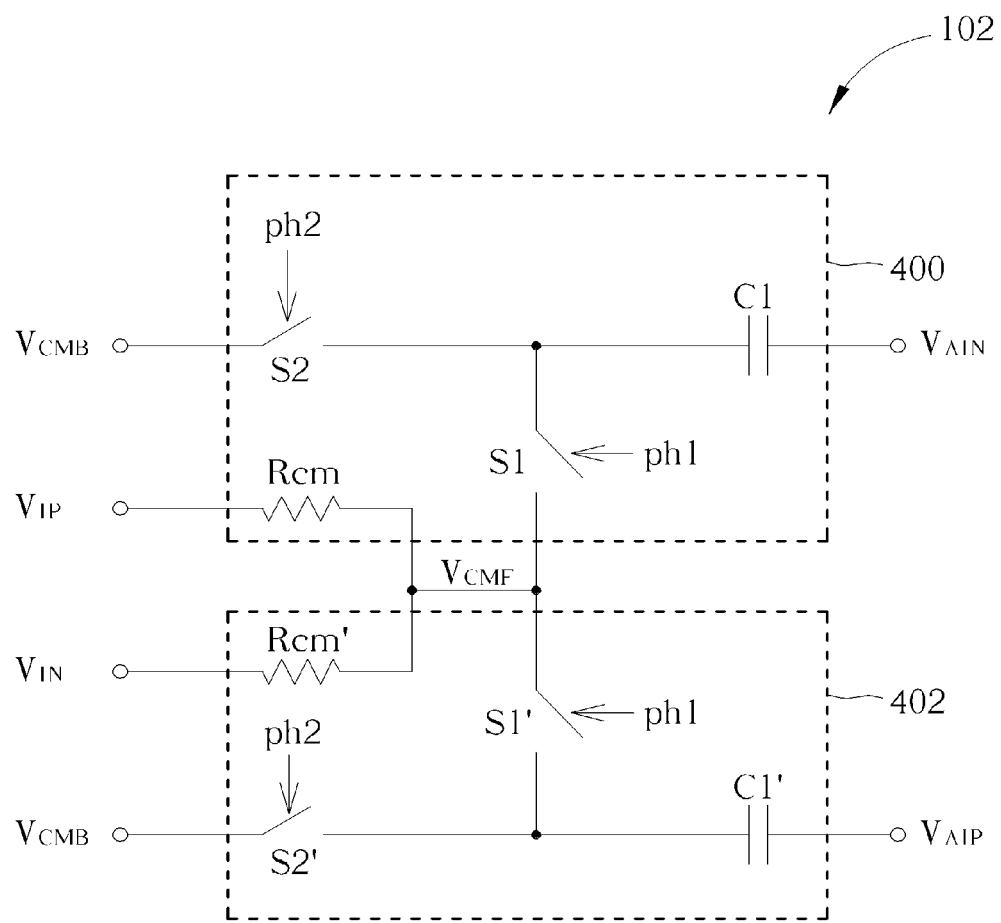
FIG. 4 is a schematic diagram of a common-mode voltage conversion circuit according to an embodiment of the present application.
Figure 5:
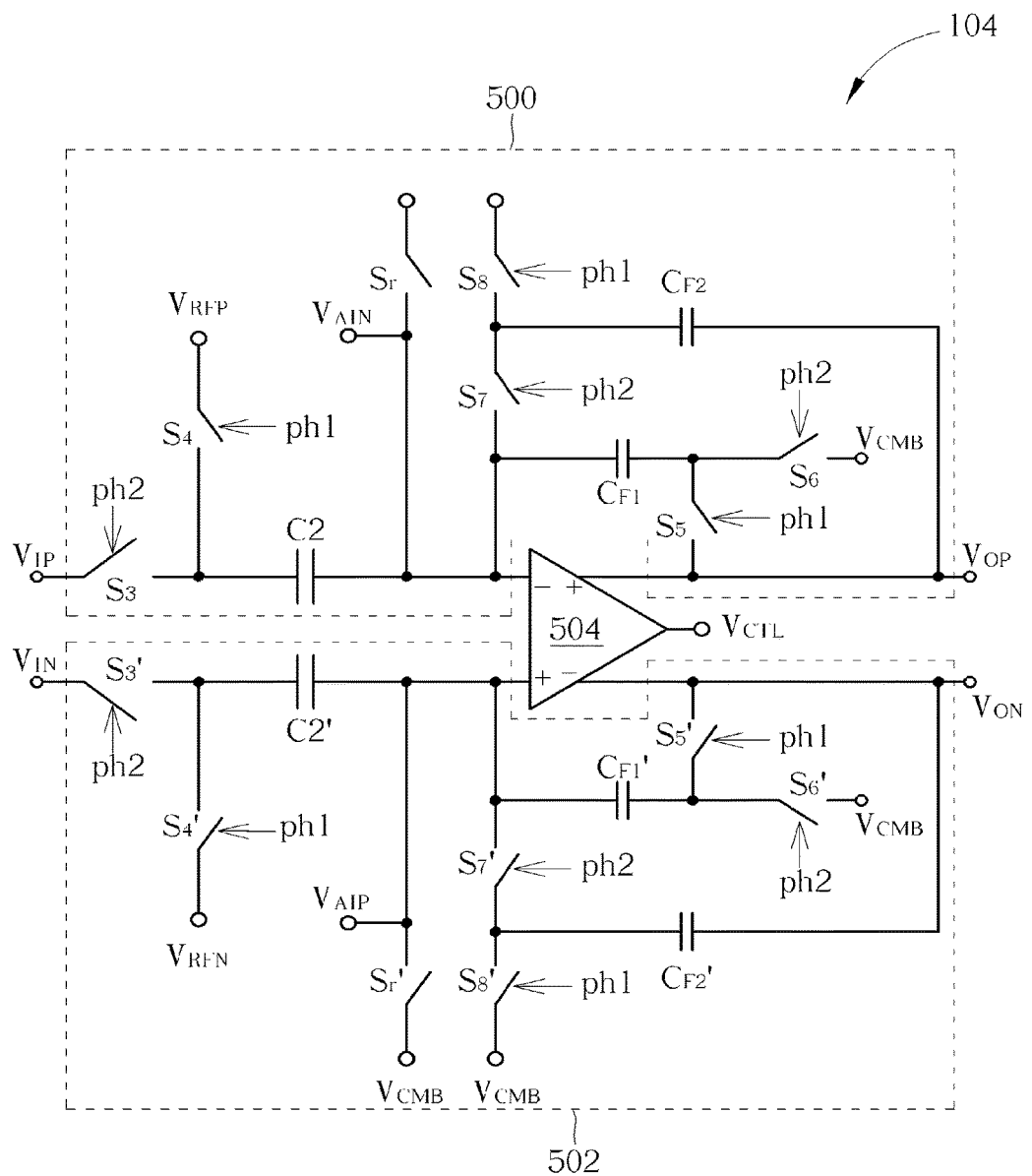
FIG. 5 is a schematic diagram of a programmable gain amplifying circuit according to an embodiment of the present application.

On the other hand, as shown in FIGS. 4 and 5, FIG. 4 is a schematic diagram of a common-mode voltage conversion circuit 102 according to an embodiment of the present application, and FIG. 5 is a schematic diagram of a programmable gain amplifying circuit 104 according to an embodiment of the present application. The common-mode voltage conversion circuit 102 includes a first common-mode half-circuit 400 and a second common-mode half-circuit 402, the first common-mode half-circuit 400 includes a common-mode resistor $R_{CM}$, common-mode switches S1, S2 and a common-mode capacitor C1, the second common-mode half-circuit 402 includes a common-mode resistor $R_{CM}'$, common-mode switches S1', S2', and a common-mode capacitor C1'. The common-mode resistor $R_{CM}$ has the same resistance value as that of the common-mode resistor $R_{CM}'$. In addition, a first terminal of the common-mode resistor $R_{CM}$ receives a pre-stage output signal $V_{IP}$, and a first terminal of the common-mode resistor $R_{CM}'$ receives a pre-stage output signal $V_{IN}$, a second terminal of the common-mode resistor $R_{CM}$ is coupled to a second terminal of the common-mode resistor $R_{CM}'$, and the voltage at the second terminals of the common-mode resistor $R_{CM}$, $R_{CM}'$ is the common-mode voltage $V_{CMF}$ between the pre-stage output signal $V_{IP}$ and $V_{IN}$. A first terminal of the common-mode switch S1 is coupled to a second terminal of the common-mode resistor $R_{CM}$, a first terminal of the common-mode switch S2 receives a reference common-mode voltage $V_{CMB}$, a second terminal of the common-mode switch S2 is coupled to a second terminal of the common-mode switch S1, and a first terminal of the common-mode capacitor C1 is coupled to the second terminal of the common-mode switch S1, a second terminal of the common-mode capacitor C1 is used to output an input signal $V_{AIP}$; similarly, a first terminal of the common-mode switch S1' is coupled to a second terminal of the common-mode resistor $R_{CM}'$, a first terminal of the common-mode switch S2' receives a reference common-mode voltage VCMB, a second terminal of the common-mode switch S2' is coupled to a second terminal of the common-mode switch S1', and a first terminal of the common-mode capacitor C1' is coupled to the second terminal of the common-mode switch S1', a second terminal of the common-mode capacitor C1' is used to output an input signal $V_{AIN}$.

The common-mode voltage conversion circuit 102 passes the input signals $V_{AIP}$, $V_{AIN}$ to the programmable gain amplifying circuit 104. As shown in FIG. 5, the programmable gain amplifying circuit 104 is a Correlated Double Sampling fully differential programmable gain amplifying circuit which can effectively suppress the non-ideal characteristics such as Offset Voltage, Limited Gain and Flicker Noise (1/f Noise) of the operational amplifier. The effects of Limited Gain and 1/f Noise can be reduced. Reducing the Limited Gain means that a smaller gain bandwidth product (GBW) can be used to reduce power consumption. Reducing the 1/f Noise can reduce the effect of low-frequency noise on an amplifier, thereby improving the SNR.

Reducing the Limited Gain can reduce the requirement for Gain Bandwidth Product by an amplifier. Since the Gain Bandwidth product is linearly related to the square of the power consumption, it is possible to further reduce the power consumption by using a Correlated Double Sampling fully differential programmable gain amplifying circuit. In addition, reducing the Flicker Noise can reduce the effect of low-frequency noise on an amplifier, thereby improving the Signal-to-Noise Ratio (SNR). The programmable gain amplifying circuit 104 includes a fully differential operational amplifier 504, a first switched capacitor half-circuit 500, and a second switched capacitor half-circuit 502. The fully differential operational amplifier 504 includes a positive input (labeled "+"), a negative input (labeled "−"), a positive output (labeled "+") and a negative output (labeled "−"). The negative input of the fully differential operational amplifier 504 is coupled to the second terminal of the common-mode switch S1' to receive the input signal $V_{AIN}$, the positive input thereof is coupled to the second terminal of the common-mode switch S1 to receive the input signal $V_{AIP}$, the positive output is used to output the output signal $V_{OP}$, and the negative output terminal is used to output the output signal $V_{ON}$.

The first switched capacitor half-circuit 500 includes a reset switch $S_r$, switches S3 to S8, a capacitor C2, and feedback capacitances $C_{F1}$ and $C_{F2}$. One terminal of the reset switch $S_r$ is coupled to the negative input of the fully differential operational amplifier 504 and the other terminal is used to receive the reference common-mode voltage $V_{CMB}$. The capacitor C2 is coupled to the negative input of the fully differential operational amplifier 504, one terminal of the switch S3 is coupled to the capacitor C2 and the other terminal is used to receive a pre-stage output signal $V_{IP}$, one terminal of the switch S4 is coupled to the capacitor C2 and the other terminal is used to receive a reference voltage $V_{RFP}$, a switch S5 is coupled to the positive output, one terminal of the switch S6 is coupled to the switch S5 and the other terminal of the switch S6 is used to receive the reference common-mode voltage $V_{CMB}$. One terminal of the feedback capacitor $C_{F1}$ is coupled to the switch S5 and the other terminal is coupled to the negative input of the fully differential operational amplifier 504. The feedback capacitor $C_{F2}$ is coupled to the positive output of the fully differential operational amplifier 504, one terminal of the switch S7 is coupled to the negative input of the fully differential operational amplifier 504 and the feedback capacitor $C_{F1}$, and the other terminal of the switch S7 is coupled to the feedback capacitor $C_{F2}$. One terminal of the switch S8 is coupled between the switch S7 and the feedback capacitor $C_{F2}$, and the other terminal is used to receive the reference common-mode voltage $V_{CMB}$.

Similarly, the second switched capacitor half-circuit 502 includes a reset switch $S_r'$, switches S3' to S8', a capacitor C2', and feedback capacitances $C_{F1}'$ and $C_{F2}'$. One terminal of the reset switch Sr' is coupled to the positive input of the fully differential operational amplifier 504 and the other terminal is used to receive the reference common-mode voltage $V_{CMB}$. The capacitor C2' is coupled to the positive input of the fully differential operational amplifier 504, one terminal of the switch S3' is coupled to the capacitor C2' and the other terminal is used to receive a pre-stage output signal $V_{IN}$, one terminal of the switch S4' is coupled to the capacitor C2' and the other terminal is used to receive a reference voltage $V_{RFN}$, a switch S5' is coupled to the negative output, one terminal of the switch S6' is coupled to the switch S5' and the other terminal of the switch S6' is used to receive the reference common-mode voltage $V_{CMB}$. One terminal of the feedback capacitor $C_{F1}'$ is coupled to the switch S5' and the other terminal is coupled to the positive input of the fully differential operational amplifier 504. The feedback capacitor $C_{F2}'$ is coupled to the negative output of the fully differential operational amplifier 504, one terminal of the switch S7' is coupled to the positive input of the fully differential operational amplifier 504 and the feedback capacitor $C_{F1}'$, and the other terminal of the switch S7' is coupled to the feedback capacitor $C_{F2}'$. One terminal of the switch S8 is coupled between the switch S7' and the feedback capacitor $C_{F2}'$, and the other terminal is used to receive the reference common-mode voltage $V_{CMB}$.

Wherein, the common-mode switches S1, S1' and the switches S4, S5, S8, S4', S5' and S8' are controlled by a frequency signal ph1, the common-mode switches S2, S2' and the switches S3, S6, S7, S3', S6', S7' are controlled by a frequency signal ph2, the frequency signal ph1 and the frequency signal ph2 do not overlap each other. When the frequency signal ph1 is at a first potential (which may be a low potential) and the frequency signal ph2 is at a second potential (which may be a high potential), the common-mode switches S2, S2' and the switches S3, S6, S7, S3', S6', S7' are turned on, and the common-mode capacitors C1, C1' of the common-mode voltage conversion circuit 102 sample and input the reference common-mode voltage $V_{CMB}$, the capacitances C2 and C2' of the programmable gain amplifying circuit 104 sample and input the common-mode voltage $V_{CMF}$; when the frequency signal ph1 is at the second potential and the frequency signal ph2 is at the first potential, the common-mode switches S2, S2' and the switches S3, S6, S7, S3', S6', S7' are turned off, and the common-mode switch S1, S1' and the switches S4, S5, S8, S4', S5', S8' are turned on, the common-mode capacitors C1, C1' of the common-mode voltage conversion circuit 102 sample and input the common-mode voltage $V_{CMF}$, the capacitances C2, C2' of the programmable gain amplifying circuit 104 sample and input the reference common-mode voltage $V_{CMB}$. In the case that the common-mode capacitors C1, C1' have the same capacitance value as that of the capacitors C2, C2', the common-mode voltage conversion circuit 102 may generate input signals $V_{AIP}$, $V_{AIN}$ with the reference common-mode voltage $V_{CMB}$ according to the charge conservation principle, and the programmable gain amplifying circuit 104 may generate an output signal $V_{OP}$ ($V_{OP}=(V_{IP}-V_{RFP})*(C2/C_{F2})+V_{CMB}$) (Equation 1) and an output signal $V_{ON}$ ($V_{ON}=(V_{IN}-V_{RFN})*(C2'/C_{F2}')+V_{CMB}$) (Equation 2). As can be seen from Equations 1 and 2, the reference voltages $V_{RFP}$, $V_{RFN}$ generated by the reference voltage generating circuit 101 can be used to eliminate the baseline signal included in the pre-stage output differential signal.

Figure 6:
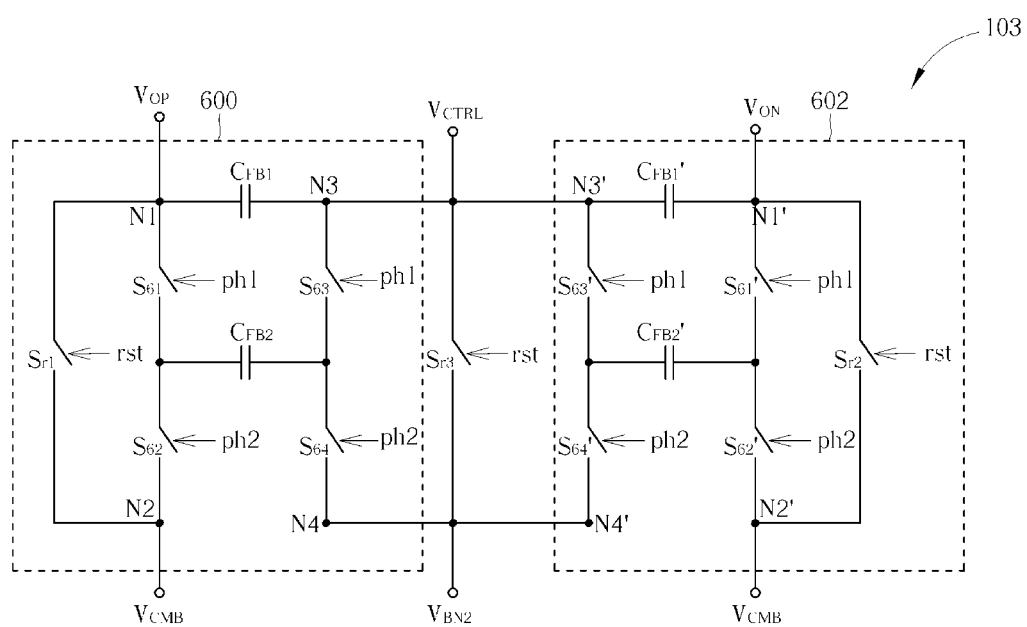
FIG. 6 is a schematic diagram of a common-mode negative feedback circuit according to an embodiment of the present application.

In addition, the fully differential operational amplifier 504 of the programmable gain amplifying circuit 104 receives the control voltage $V_{CTL}$ generated by the common-mode negative feedback circuit 103 to quickly establish the common-mode negative feedback of the programmable gain amplifying circuit 104. In detail, as shown in FIG. 6, FIG. 6 is a schematic diagram of a common-mode negative feedback circuit 103 according to an embodiment of the present application. The common-mode negative feedback circuit 103 includes a first negative feedback half-circuit 600, a second negative feedback half-circuit 602 and a negative feedback reset switch $S_{r3}$. For the convenience of explanation, the first negative feedback half-circuit 600 is labeled with a first terminal N1, a second terminal N2, a third terminal N3, and a fourth terminal N4, and the second negative feedback half-circuit 602 is labeled with a first terminal N1', a second terminal N2', a third terminal N3', and a fourth terminal N4'. One terminal of the negative feedback reset switch $S_{r3}$ is coupled to the third terminal N3 of the first negative feedback half-circuit 600 and the third terminal N3' of the second negative feedback half-circuit 602, and the other terminal of the negative feedback reset switch $S_{r3}$ is coupled to the fourth terminal N4 of the first negative feedback half-circuit 600 and the fourth terminal N4' of the second negative feedback half-circuit 602. The first terminal N1 of the first negative feedback half-circuit 600 is coupled to the positive output of the fully differential operational amplifier 504 for receiving the output signal $V_{OP}$; the first terminal N1' of the second negative feedback half-circuit 602 is coupled to the negative output of the fully differential operational amplifier 504 for receiving the output signal $V_{ON}$. The second terminal N2 of the first negative feedback half-circuit 600 and the second terminal N2' of the second negative feedback half-circuit 602 are coupled to the reference voltage generation circuit 101 for receiving the reference common-mode voltage $V_{CMB}$. The third terminal N3 of the first negative feedback half-circuit 600 and the third terminal N3' of the second negative feedback half-circuit 602 are coupled to the fully differential operational amplifier 504 for outputting the control voltage $V_{CTL}$ to the fully differential operational amplifier 504. The fourth terminal N4 of the first negative feedback half-circuit 600 and the fourth terminal N4' of the second negative feedback half-circuit 602 are used to receive a bias voltage $V_{BN2}$.

The first negative feedback half-circuit 600 includes a negative feedback reset switch $S_{r1}$, switches $S_{61}$, $S_{62}$, $S_{63}$, $S_{64}$ and capacitors $C_{FB1}$ and $C_{FB2}$, the negative feedback reset switch $S_{r1}$ is coupled between the first terminal N1 and the second terminal N2 of the first negative feedback half-circuit 600, the switches $S_{61}$, $S_{62}$, $S_{63}$ and $S_{64}$ are respectively coupled to the first terminal N1, the second terminal N2, the third terminal N3 and the fourth terminal N4 of the first negative feedback half-circuit 600, the capacitor $C_{FB1}$ is coupled between the first terminal N1 and the third terminal N3 of the first negative feedback half-circuit 600, a first terminal of the capacitor $C_{FB2}$ is coupled between the switch $S_{61}$ and the switch $S_{62}$, and a second terminal of the capacitor $C_{FB2}$ is coupled between the switch $S_{63}$ and the switch $S_{64}$.

Similarly, The second negative feedback half-circuit 602 includes a negative feedback reset switch Sr2, switches $S_{61}'$, $S_{62}'$, $S_{63}'$, $S_{64}'$ and capacitors $C_{FB1}'$ and $C_{FB2}'$, the negative feedback reset switch Sr2 is coupled between the first terminal N1' and the second terminal N2' of the second negative feedback half-circuit 602, the switches $S_{61}'$, $S_{62}'$, $S_{63}'$ and $S_{64}'$ are respectively coupled to the first terminal N1', the second terminal N2', the third terminal N3' and the fourth terminal N4' of the second negative feedback half-circuit 602, the capacitor $C_{FB1}'$ is coupled between the first terminal N1' and the third terminal N3' of the second negative feedback half-circuit 602, a first terminal of the capacitor $C_{FB2}'$ is coupled between the switch $S_{61}'$ and the switch $S_{62}'$, and a second terminal of the capacitor $C_{FB2}'$ is coupled between the switch $S_{63}'$ and the switch $S_{64}'$.

Figure 7:
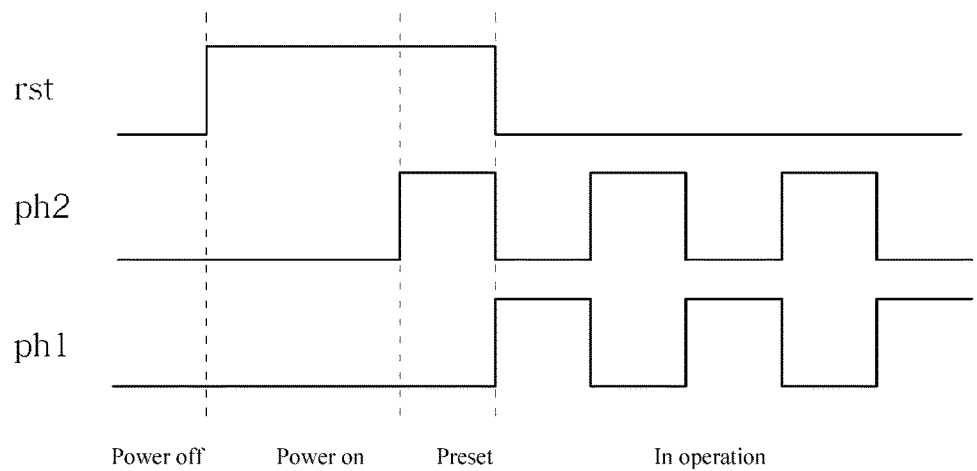
FIG. 7 is a plurality of waveform diagrams according to embodiments of the present application.

In addition, the switches $S_{61}$, $S_{61}'$, $S_{63}$, $S_{63}'$ are controlled by the frequency signal ph1 and the switches $S_{62}$, $S_{62}'$, $S_{64}$, $S_{64}'$ are controlled by the frequency signal ph2, the negative feedback reset switches $S_{r1}$, $S_{r2}$, and $S_{r3}$ are controlled by a reset signal rst. The operation of common-mode negative feedback circuit 103 can be divided into a power-off phase, a power-on phase, a preset phase, and a session phase, based on the frequency signal ph1, the frequency signal ph2, and the reset signal rst. The waveforms of the frequency signal ph1, the frequency signal ph2, and the reset signal rs are shown in FIG. 7. When the common-mode negative feedback circuit 103 is in the power-off phase, the frequency signal ph1, the frequency signal ph2, and the reset signal rst are all at a low potential (ie., the first potential), and all switches of the common-mode negative feedback circuit 103 are turned off. When the common-mode negative feedback circuit 103 is in the power-on phase, only the reset signal rst is at a high potential (i.e., the second potential), the negative feedback reset switches $S_{r1}$, $S_{r2}$, $S_{r3}$ are turned on, the output signals $V_{OP}$, $V_{ON}$ are preset to the reference common-mode voltage $V_{CMB}$, and the control voltage $V_{CTL}$ is preset to the bias voltage VBN2. When the common-mode negative feedback circuit 103 is in the preset phase, the reset signal rst is maintained at a high potential, the frequency signal ph2 is pulled up to a high potential and the frequency signal ph1 is maintained at a low potential, the first terminals of the capacitors $C_{FB2}$, $C_{FB2}'$ are preset to the reference common-mode voltage $V_{CMB}$, and the second terminal of the capacitors $C_{FB2}$, $C_{FB2}'$ are preset to the bias voltage $V_{BN2}$. When the common-mode negative feedback circuit 103 is in a session phase, the reset signal rst is pulled down to a low potential, the negative feedback reset switches $S_{r1}$, $S_{r2}$, $S_{r3}$ are turned off, the frequency signal ph2 is also pulled down to a low potential, and the frequency signal ph2 is pulled up to a high potential so as not to overlap the frequency signal ph1, thus, the common-mode negative feedback of the programmable gain amplifying circuit 104 is established after several cycles.

In short, the common-mode negative feedback circuit 103 presets the output signals $V_{OP}$, $V_{ON}$ to the reference common-mode voltage $V_{CMB}$ and the control voltage $V_{CTL}$ to the bias voltage $V_{BN2}$ by using the negative feedback reset switches $S_{r1}$, $S_{r2}$, $S_{r3}$, such that the time required for the programmable gain amplifying circuit 104 to establish the common-mode negative feedback is drastically reduced.

Figure 8:
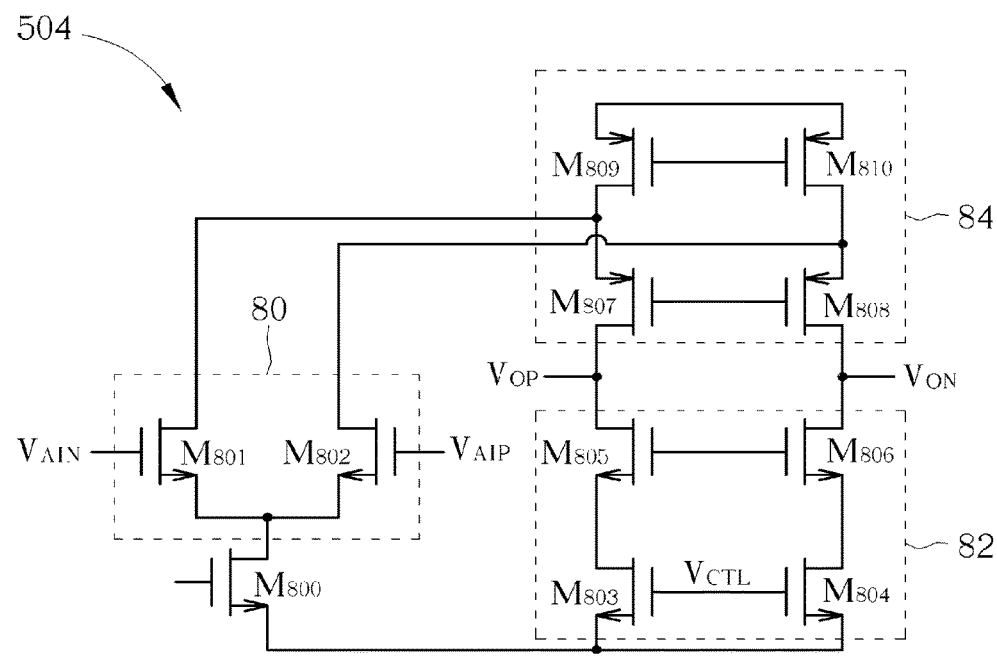
FIG. 8 is a schematic diagram of a fully differential operational amplifier according to an embodiment of the present application.

Specifically, the common-mode negative feedback circuit 103 passes the control voltage $V_{CTL}$ to the fully differential operational amplifier 504 of the programmable gain amplifying circuit 104. The detailed circuit configuration of the fully differential operational amplifier 504 can be referred to FIG. 8, as shown in FIG. 8, the fully differential operational amplifier 504 includes a bias transistor $M_{800}$, a differential amplifying circuit 80, a current mirror 82, and a current mirror 84. The differential amplifying circuit 80 includes transistors $M_{801}$ and $M_{802}$, a gate of the transistor $M_{801}$ is used to receive the input signal $V_{AIN}$, a gate of the transistor $M_{802}$ is used to receive the input signal $V_{AIP}$, the sources of the transistors $M_{801}$ and $M_{802}$ are coupled to a drain of the bias transistor $M_{800}$, a gate of the bias transistor $M_{800}$ receives a bias voltage $V_{BN}$ to provide bias currents of the transistors $M_{801}$, $M_{802}$. The current mirror 82 includes transistors $M_{803}$ to $M_{806}$, gates of the transistors $M_{803}$ and $M_{804}$ are used to receive the control voltage $V_{CTL}$, drains of the transistors $M_{803}$ and $M_{804}$ are respectively coupled to the sources of the transistors $M_{805}$ and $M_{806}$, and a drain of the transistor $M_{805}$ is used to output an output signal $V_{OP}$, and a drain of the transistor $M_{806}$ is used to output the output signal $V_{ON}$. The current mirror 84 includes transistors $M_{807}$ to $M_{810}$, drains of the transistors $M_{807}$ and $M_{808}$ are coupled to drains of the transistors $M_{805}$ and $M_{806}$, a source of the transistor $M_{807}$ is coupled to drains of the transistors $M_{801}$ and $M_{809}$, the source of the transistor $M_{808}$ is coupled to drains of the transistors $M_{802}$ and $M_{810}$. It should be noted that gates of the transistors $M_{803}$, $M_{804}$ are used to receive the control voltage $V_{CTL}$ to stabilize the common-mode voltage of the fully differential operational amplifier 504. In addition, the current mirrors 82, 84 provide a relative large output impedance to the differential amplifying circuit 80, and increase the gain of the differential amplifying circuit 80.

As described above, the amplifying circuit 10 adjusts the common-mode voltage of the pre-stage output signals $V_{IP}$ and $V_{IN}$ by using the reference voltage generating circuit 101 and the common-mode voltage conversion circuit 102; and generates the reference voltages $V_{RFP}$ and $V_{RFN}$ by using the reference voltage generating circuit 101 to eliminate baseline signals which are in the pre-stage output signals $V_{IP}$ and $V_{IN}$; and quickly establishes common-mode negative feedback of the programmable gain amplifying circuit 104 by using the common-mode negative feedback circuit 103, such that the time for establishing common-mode is reduced, the operation time of the amplifying circuit 10 is shorten, and the average power consumption is reduced; the proportion between the transistors $M_{301}$ and $M_{302}$, or the proportion between the transistors $M_{303}$ and $M_{304}$, the proportion between the transistors $M_{305}$ and $M_{306}$ and the proportion between the transistors $M_{307}$ and M308 is adjusted, such that the power consumption is further reduced; the requirement for gain bandwidth product by the amplifier is reduced by using the programmable gain amplifying circuit 104 with a Correlated Double Sampling structure, that is, the power consumption is reduced. In contrast, the amplifying circuit 10 can solve the problem that voltages of the pre-stage circuit and the post-stage circuit of conventional programmable gain amplifier do not match each other, and effectively eliminate the baseline signal which is in the pre-stage output differential signal, at the same time, quickly establish the common-mode negative feedback of the programmable gain amplifying circuit 104.

In summary, the amplifying circuit of the present application allows that the programmable gain amplifying circuit is not affected by the common-mode voltage output from the pre-stage circuit, and can self-adjust the common-mode voltage output from the programmable gain amplifying circuit itself, such that the output common-mode voltage is consistent with the post-stage circuit to eliminate the affection on the post-stage circuit, and is not affected by the pre-stage common-mode voltage, and can adaptively adjust the output common-mode voltage to be consistent with the post-stage circuit to eliminate the affection of common-mode voltage of the post-stage circuit. At the same time, the present application can improve the power consumption: a) the common-mode negative-feedback circuit reduces the time for establishing common-mode, such that the operation time of the whole amplifier is shorten, and eventually, the average power consumption is reduced; b) the reference voltage generating circuit adjusts the proportion between transistors to reduce the power consumption; c) the amplifier uses a CDS structure to reduce the requirement for the gain bandwidth product by the amplifier, and the Gain Bandwidth product is linearly related to the square of the power consumption, so the requirement for the power consumption by the amplifier is reduced by using a CDS structure. In addition, the amplifying circuit of the present application can effectively eliminate the baseline signal which is in the pre-stage output differential signal and shorten the time required to establish the common-mode negative feedback, which has the following advantages such as large dynamic range, strong working stability, low power consumption, short common-mode establishing time and matching with the common-mode voltages of the pre-stage circuit and the post-stage circuit.

The above description is only a preferred embodiment of the present application, and variations and modifications within the scope of the present disclosure are intended to be within the scope of the present application.

What is claimed is:

1. An amplifying circuit coupled to a post-stage circuit, comprising:
    an amplifying sub-circuit configured to receive a pre-stage output differential signal; and
    a reference voltage generating circuit coupled to the amplifying sub-circuit;
    wherein the reference voltage generating circuit is configured to generate a reference common-mode voltage, the difference between the reference common-mode voltage and a post-stage common-mode voltage of the post-stage circuit is less than or equal to a predetermined range;
    wherein the reference voltage generating circuit is configured to generate a first reference voltage and a second reference voltage, a common-mode voltage of the first reference voltage and the second reference voltage is the reference common-mode voltage, the first reference voltage and the second reference voltage are used to eliminate a baseline signal of the pre-stage output differential signal.

2. The amplifying circuit according to claim 1, wherein the reference voltage generating circuit comprises:
    a bias circuit;
    a first differential amplifying circuit coupled to the bias circuit and configured to receive the post-stage common-mode voltage;
    a first current mirror coupled to the first differential amplifying circuit and configured to supply a current of the first differential amplifying circuit;
    a first reference resistor coupled to the first current mirror and configured to output the first reference voltage;
    a second reference resistor coupled to the first differential amplifying circuit and the first reference resistor, and configured to output the second reference voltage; and
    a voltage equalization circuit coupled to the first differential amplifying circuit.

3. The amplifying circuit according to claim 2, wherein the bias circuit comprises:
    a first transistor;
    a second transistor coupled to the first transistor;
    wherein a control terminal of the second transistor is coupled to a control terminal of the first transistor, and a first terminal of the second transistor is coupled to a first terminal of the first transistor.

4. The amplifying circuit according to claim 3, wherein the first differential amplifying circuit is coupled to the second transistor, the first differential amplifying circuit comprises:
    a third transistor for receiving the post-stage common-mode voltage; and
    a fourth transistor coupled to the third transistor and configured for outputting the reference common-mode voltage;
    wherein a second terminal of the third transistor is coupled to a second terminal of the fourth transistor, and the third transistor comprises a control terminal for receiving the post-stage common-mode voltage, a control terminal of the fourth transistor is coupled between the first reference resistor and the second reference resistor to output the reference common-mode voltage.

5. The amplifying circuit according to claim 2, wherein the first current mirror comprises:
    a fifth transistor; and
    a sixth transistor;
    wherein a first terminal of the fifth transistor is coupled to a first terminal of the sixth transistor and a control terminal of the fifth transistor is coupled to a control terminal of the sixth transistor.

6. The amplifying circuit according to claim 5, wherein the first current mirror further comprises:
    a seventh transistor; and
    an eighth transistor;
    wherein a second terminal of the fifth transistor is coupled to a first terminal of the seventh transistor and a second terminal of the sixth transistor is coupled to a first terminal of the eighth transistor, a control terminal of the seventh transistor and a control terminal of the eighth transistor receive a bias voltage, the control terminal of the fifth transistor and the control terminal of the sixth transistor are coupled to a second terminal of the seventh transistor, the second terminal of the seventh transistor is coupled to the voltage equalization circuit, and a second terminal of the eighth transistor is coupled to the first reference resistor.

7. The amplifying circuit according to claim 2, wherein the voltage equalization circuit comprises:
    a second differential amplifying circuit coupled to the bias circuit and the first differential amplifying circuit; and
    a second current mirror coupled to the second differential amplifying circuit.

8. The amplifying circuit according to claim 7, wherein the second differential amplifying circuit comprises:
    a ninth transistor; and
    a tenth transistor;
    wherein a first terminal of the ninth transistor and a first terminal of the tenth transistor are coupled to the bias circuit, a control terminal of the ninth transistor and a control terminal of the tenth transistor are coupled to the first differential amplifying circuit.

9. The amplifying circuit according to claim 8, wherein the second current mirror comprises:
    an eleventh transistor; and
    a twelfth transistor coupled to the eleventh transistor,
    wherein a first terminal of the eleventh transistor is coupled to a first terminal of the twelfth transistor, a control terminal of the eleventh transistor and a control terminal of the twelfth transistor are coupled between a second terminal of the eleventh transistor and a second terminal of the ninth transistor, a second terminal of the twelfth transistor is coupled to a second terminal of the tenth transistor.

10. The amplifying circuit according to claim 9, wherein the voltage equalization circuit further comprises a thirteenth transistor, the control terminal of the thirteenth transistor is coupled between the second terminal of the tenth transistor and the second terminal of the twelfth transistor, and the first terminal of the thirteenth transistor is coupled between a control terminal of the tenth transistor and the first differential amplifying circuit.

11. The amplifying circuit according to claim 2, wherein the first reference resistance has the same resistance value as that of the second reference resistance.

12. The amplifying circuit according to claim 2, wherein a first current of the first transistor is in proportion to a second current passing through the second transistor.

13. The amplifying circuit according to claim 1, further comprising:
a common-mode voltage conversion circuit coupled to the reference voltage generating circuit and the amplifying sub-circuit and configured to convert a pre-stage output differential signal into a differential input signal according to the reference common-mode voltage;
wherein the pre-stage output differential signal includes a first pre-stage output signal and a second pre-stage output signal, the differential input signal includes a first input signal and a second input signal;
wherein a common-mode voltage of the first input signal and the second input signal is the reference common-mode voltage.

14. The amplifying circuit according to claim 13, wherein the common-mode voltage conversion circuit comprises:
a first common-mode half-circuit, comprising:
a first common-mode resistor comprising a first terminal configured to receive a first pre-stage output signal, and a second terminal;
a first common-mode switch coupled to the first common-mode resistor and controlled by a first frequency signal;
a second common-mode switch configured to receive the reference common-mode voltage and coupled to the first common-mode switch, wherein the second common-mode switch is controlled by a second frequency signal which does not overlap with the first frequency signal; and
a first common-mode capacitor comprising one terminal coupled between the first common-mode switch and the second common-mode switch, and the other terminal of the first common-mode capacitor is configured to output a first input signal; and
a second common-mode half-circuit coupled to the first common-mode half-circuit, the second common-mode half-circuit comprises:
a second common-mode resistor comprising a first terminal for receiving a second pre-stage output signal, and a second terminal, wherein the second terminal of the first common-mode resistor is coupled to the second terminal of the second common-mode resistor;
a third common-mode switch coupled to the second common-mode resistor and controlled by the first frequency signal;
a fourth common-mode switch configured to receive the reference common-mode voltage and coupled to the third common-mode switch, the fourth common-mode switch is controlled by the second frequency signal; and
a second common-mode capacitor comprising one terminal coupled between the third common-mode switch and the fourth common-mode switch, and the other terminal of the second common-mode capacitor is configured to output a second input signal.

15. The amplifying circuit according to claim 14, wherein the first common-mode resistor has the same resistance value as that of the second common-mode resistance.

16. The amplifying circuit according to claim 13, further comprising:
a common-mode negative feedback circuit coupled to the reference voltage generating circuit and the amplifying sub-circuit and configured to generate a control voltage to the amplifying sub-circuit according to the reference common-mode voltage and a differential output signal of the amplifying sub-circuit;
wherein the differential output signal comprises a first output signal and a second output signal.

17. The amplifying circuit according to claim 16, wherein the common-mode negative feedback circuit comprises:
a first negative feedback half-circuit;
a second negative feedback half-circuit; and
a third negative feedback reset switch coupled to the first negative feedback half-circuit and the second negative feedback half-circuit.

18. The amplifying circuit according to claim 17, wherein the first negative feedback half-circuit comprises a first terminal, a second terminal, a third terminal, and a fourth terminal, the first terminal is configured to receive the first output signal of the amplifying sub-circuit, the second terminal is configured to receive the reference common-mode voltage, the third terminal is configured to output the control voltage, the fourth terminal is configured to receive a bias voltage, the first negative feedback half-circuit comprises:
a first negative feedback reset switch coupled between the first terminal and the second terminal of the first negative feedback half-circuit;
a first switch coupled to the first terminal of the first negative feedback half-circuit;
a second switch coupled to the second terminal of the first negative feedback half-circuit;
a third switch coupled to the third terminal of the first negative feedback half-circuit;
a fourth switch coupled to the fourth terminal of the first negative feedback half-circuit;
a first capacitor coupled between the first terminal and the third terminal of the first negative feedback half-circuit; and
a second capacitor, wherein one terminal of the second capacitor is coupled between the first switch and the second switch of the first negative feedback half-circuit and the other terminal of the second capacitor is coupled between the third switch and the fourth switch of the first negative feedback half-circuit.

19. The amplifying circuit according to claim 18, wherein the first switch and the third switch of the first negative feedback half-circuit is controlled by a first frequency signal, the second switch and the fourth switch of the first negative feedback half-circuit is controlled by a second frequency signal, the first negative feedback reset switch and the third negative feedback reset switch are controlled by a reset signal, the first frequency signal and the second frequency signal do not overlap with each other.

20. The amplifying circuit according to claim 1, wherein the amplifying sub-circuit is a programmable gain amplifying circuit.

21. The amplifying circuit according to claim 20, wherein the programmable gain amplifying circuit comprises:
a fully differential operational amplifier comprises:
a first input terminal for receiving the first input signal;
a second input terminal for receiving the second input signal;
a first output terminal for outputting a first output signal; and a second output terminal for outputting a second output signal;

a first switched capacitor half-circuit coupled to the first input terminal and the first output terminal of the fully differential operational amplifier; and a second switched capacitor half-circuit coupled to the second input terminal and the second output terminal of the fully differential operational amplifier.

22. The amplifying circuit according to claim 21, wherein the first switched capacitor half-circuit comprises:

a reset switch comprising one terminal coupled to the first input terminal and the other terminal for receiving the reference common-mode voltage;

a first capacitor coupled to the first input terminal;

a first switch comprising one terminal coupled to the first capacitor and the other terminal for receiving the first pre-stage output signal;

a second switch comprising one terminal coupled to the first capacitor and the other terminal for receiving the first reference voltage;

a third switch coupled to the first output terminal;

a fourth switch comprising one terminal coupled to the third switch and the other terminal for receiving the reference common-mode voltage;

a first feedback capacitor comprising one terminal coupled to the third switch and the other terminal coupled to the first input terminal;

a second feedback capacitor coupled to the first output terminal;

a fifth switch comprising one terminal coupled to the first input and the other terminal coupled to the second feedback capacitor; and a sixth switch comprising one terminal coupled between the fifth switch and the second feedback capacitor and the other terminal for receiving the reference common-mode voltage.

23. The amplifying circuit according to claim 22, wherein the second switched capacitor half-circuit comprises:

a reset switch comprising one terminal coupled to the second input and the other terminal for receiving the reference common-mode voltage;

a first capacitor coupled to the second input terminal;

a first switch comprising one terminal coupled to the first capacitor and the other terminal for receiving the second pre-stage output signal;

a second switch comprising one terminal coupled to the first capacitor and the other terminal for receiving the second reference voltage;

a third switch coupled to the second output terminal;

a fourth switch comprising one terminal coupled to the third switch and the other terminal for receiving the reference common-mode voltage;

a first feedback capacitor comprising one terminal coupled to the third switch and the other terminal coupled to the second input terminal;

a second feedback capacitor coupled to the second output terminal;

a fifth switch comprising one terminal coupled to the second input and the other terminal coupled to the second feedback capacitor; and a sixth switch comprising one terminal coupled between the fifth switch and the second feedback capacitor and the other terminal for receiving the reference common-mode voltage.

24. The amplifying circuit according to claim 21, wherein the fully differential operational amplifier comprises:

a bias transistor;

a third current mirror;

a fourth current mirror coupled to the third current mirror; and a third differential amplifying circuit coupled between the bias transistor and the fourth current mirror.

25. The amplifying circuit according to claim 24, wherein the third differential amplifying circuit comprises:

a first transistor comprising a control terminal for receiving the second input signal; and a second transistor comprising a control terminal for receiving the first input signal; and the third current mirror comprises:

a third transistor comprising a control terminal;

a fourth transistor comprising a control terminal coupled to the control terminal of the third transistor;

a fifth transistor comprising:
a control terminal;
a first terminal coupled to the third transistor; and
a second terminal for outputting the first output signal; and a sixth transistor comprising:
a control terminal coupled to the control terminal of the fifth transistor;
a first terminal coupled to the fourth transistor; and
a second terminal for outputting the second output signal.

26. The amplifying circuit according to claim 24, wherein the fourth current mirror comprises:

a seventh transistor comprising:
a control terminal;
a first terminal coupled to the first transistor; and
a second terminal coupled to the fifth transistor;

an eighth transistor comprising:
a control terminal coupled to the control terminal of the seventh transistor,
a first terminal coupled to the second transistor; and
a second terminal coupled to the second terminal of the sixth transistor;

a ninth transistor comprising:
a control terminal;
a first terminal; and
a second terminal coupled to the first terminal of the seventh transistor; and a tenth transistor comprising:
a control terminal coupled to the control terminal of the ninth transistor;
a first terminal coupled to the first terminal of the ninth transistor; and
a second terminal coupled to the first terminal of the eighth transistor;

wherein the control terminals of the third transistor and the fourth transistor receive the control voltage.

* * * * *